United States Patent [19]

Li

[11] Patent Number: 5,444,293

[45] Date of Patent: Aug. 22, 1995

[54] STRUCTURE AND METHOD FOR PROVIDING A LEAD FRAME WITH ENHANCED SOLDER WETTING LEADS

[75] Inventor: Tung L. Li, Hong Kong, Hong Kong

[73] Assignee: OPL Limited, Tsuen Wan, Hong Kong

[21] Appl. No.: 125,638

[22] Filed: Sep. 22, 1993

[51] Int. Cl.6 .................... H01L 27/48; H01L 29/46; H01L 29/44; H01L 29/52
[52] U.S. Cl. ...................................... 257/666; 257/779
[58] Field of Search ............... 257/666, 669, 674, 677, 257/704, 779, 668, 701

[56] References Cited

U.S. PATENT DOCUMENTS 4,099,200 7/1978 Koutalides ........................... 257/666
4,920,074 4/1990 Shimizu et al. ...................... 257/666

Primary Examiner—Sara W. Crane
Assistant Examiner—S. V. Clark
Attorney, Agent, or Firm—Skjerven, Morrill MacPherson, Franklin & Friel

[57] ABSTRACT

A lead frame for used in a surface mount package is provided leads which are each notched at the tip of the lead to reduce the exposed area of based metal and to increase the area on which solder wetting can take place when bonded to conductive traces of a printed circuit board. In one embodiment, the thickness of the tip of the lead is reduced to further the area over which soldering wetting takes place. In that embodiment, the exposed base metal area is reduced by 85 percent.

3 Claims, 5 Drawing Sheets (Pior Art)

(Pior Art)

(Pior Art)

STRUCTURE AND METHOD FOR PROVIDING A LEAD FRAME WITH ENHANCED SOLDER WETTING LEADS

BACKGROUND OF THE INVENTION

1. Field of the Invention

The present invention relates to the design of a package for an integrated circuit; and, in particular, relates to the design of lead frames for a surface mount package of an integrated circuit.

2. Discussion of the Related Art

In the manufacture of a surface mount package for an integrated circuit, the solder plated leads of a lead frame in such package are trimmed to a desired length prior to mounting the package on a printed circuit board. FIG. 1 shows a prior art surface mount package 100 being mounted on a printed circuit board 150. Package 100 typically have a large number of leads, typically exceeding 30. For clarity, FIG. 1 shows only one lead 101. Printed circuit board 150 has plated on one surface a number of conductive metal traces to electrically contact the leads of package 100. In FIG. 1, lead 101 is shown contacted to conductive metal trace 102.

The leads of package 100 form a part of a lead frame to which the semiconductor die of the integrated circuit is electrically coupled. The manufacturing process of the lead frame, and the assembly process which attaches the semiconductor die, bonds the contact pads on the semiconductor die to the leads of the lead frame, and forms the encapsulation of package 100, are well known to one of ordinary skill in the art. The leads of the lead frame are each coated with a coat of solder material. This solder material can be tin, tin-lead (common "solder"), or palladium.

At one step in the assembly process of package 100, the leads of package 100 are trimmed to the desired length. FIG. 2a is a vertical section of lead 101, which shows lead 101 comprising a base metal core 120, which is typically formes by copper or a copper alloy, and a coat 121 of a solder material on base metal core 120. Lead 101 is trimmed at position 103 to the desired length, which is typically determined by the requirements of the integrated circuit's application. As shown in FIG. 2a, because of the trim, a surface 122 of base metal core 120 is exposed.

After package 100 is placed onto printed circuit board 150, heat is applied to the leads to bond the solder material of the leads to the copper traces of printed circuit board 150. This heating step is typically applied by an infra-red radiation reflow step, although a hot bar (i.e. soldering iron), or a vapor reflow step can also be used. The solder material on the leads of package 100 are liquified and wet the conductive metal traces of printed circuit board 150 to form good electrical contacts. Referring again to FIG. 1, solder material 104 is shown to bond lead 101 to metal trace 102. In general, the larger the surface area of lead 101 involved in solder wetting, from both mechanical and electrical points of view, the better the resulting contact would be. In some applications, wetting of 85% along the side surfaces of the portion of the lead contacting the printed circuit board is required.

However, as shown in FIG. 2a, trimming a lead at its desired length leaves an exposed surface not coated with the solder material. Consequently, when the lead is bonded to a conductive metal trace of a printed circuit board, wetting would not result along the exposed surface. FIG. 2b is a top view of lead 101 showing wetting occuring only on two sides of the lead. Often, this absence of wetting results in package 100 being rejected for not meeting the requirements of the intended application.

SUMMARY OF THE INVENTION

In accordance with the present invention, the leads of a lead frame in an integrated circuit package are each provided a notched area so as to reduce the cross sectional area of exposed base metal when the leads are trimmed, and to increase the total surface area for coating a solder material. When the leads are trimmed at the notched area, each lead would then have a tip at which solder wetting can occur.

In one embodiment of the present invention, a notch is defined by photolithographical method on each side of a lead of the lead frame and created by a subsequent etching step prior to a coating step which provides a coat of solder material over the length of lead. In that embodiment, at the notched area, the thickness of the lead is also reduced by defining and creating a trench area using photolithographic and etching steps. The combined effects of the notches and the trench reduces the resulting exposed base metal area of the lead by 85 per cent. At the same time, the coat of solder material form a fillet filling the area excavated from the lead, such that the resulting tip of the lead provides generous wetting on the printed circuit board. Consequently, superb mechanical and electrical performance is achieved.

The present invention is better understood upon consideration of the detailed description below and the accompanying drawings.

DETAILED DESCRIPTION OF THE PREFERRED EMBODIMENTS

Figure 1:
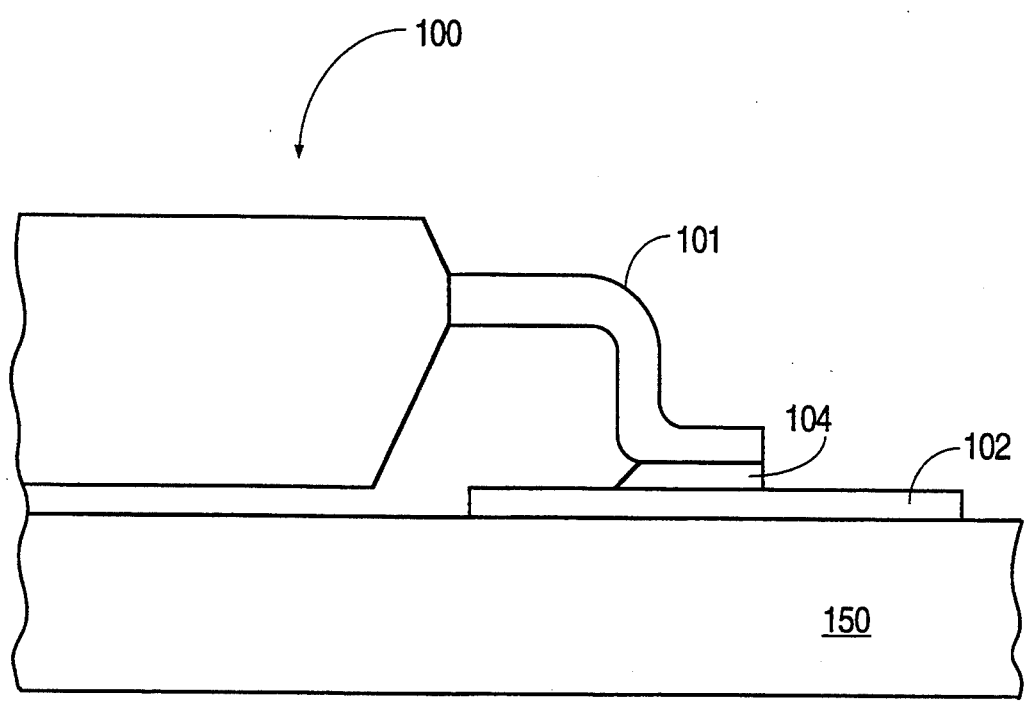
FIG. 1 shows a surface mount package 100 of the prior art mounted on a printed circuit board 150.
Figure 2A:
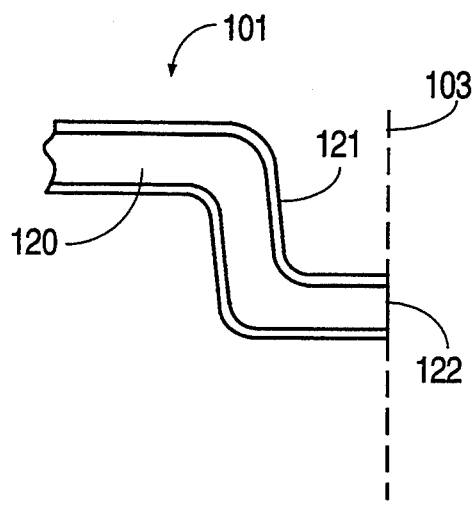
FIG. 2a is a vertical section of a lead 101 of surface mount package 100, showing an exposed base metal end at the position where lead 101 is trimmed.
Figure 2B:
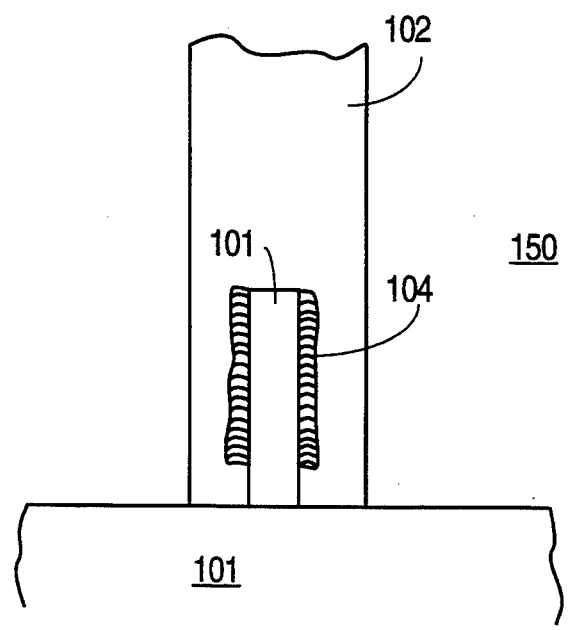
FIG. 2b is a top view of lead 101 of package 100, showing solder wetting only on two sides of lead 101 when bonded to the metal trace 102 of circuit board 150.
Figure 3:
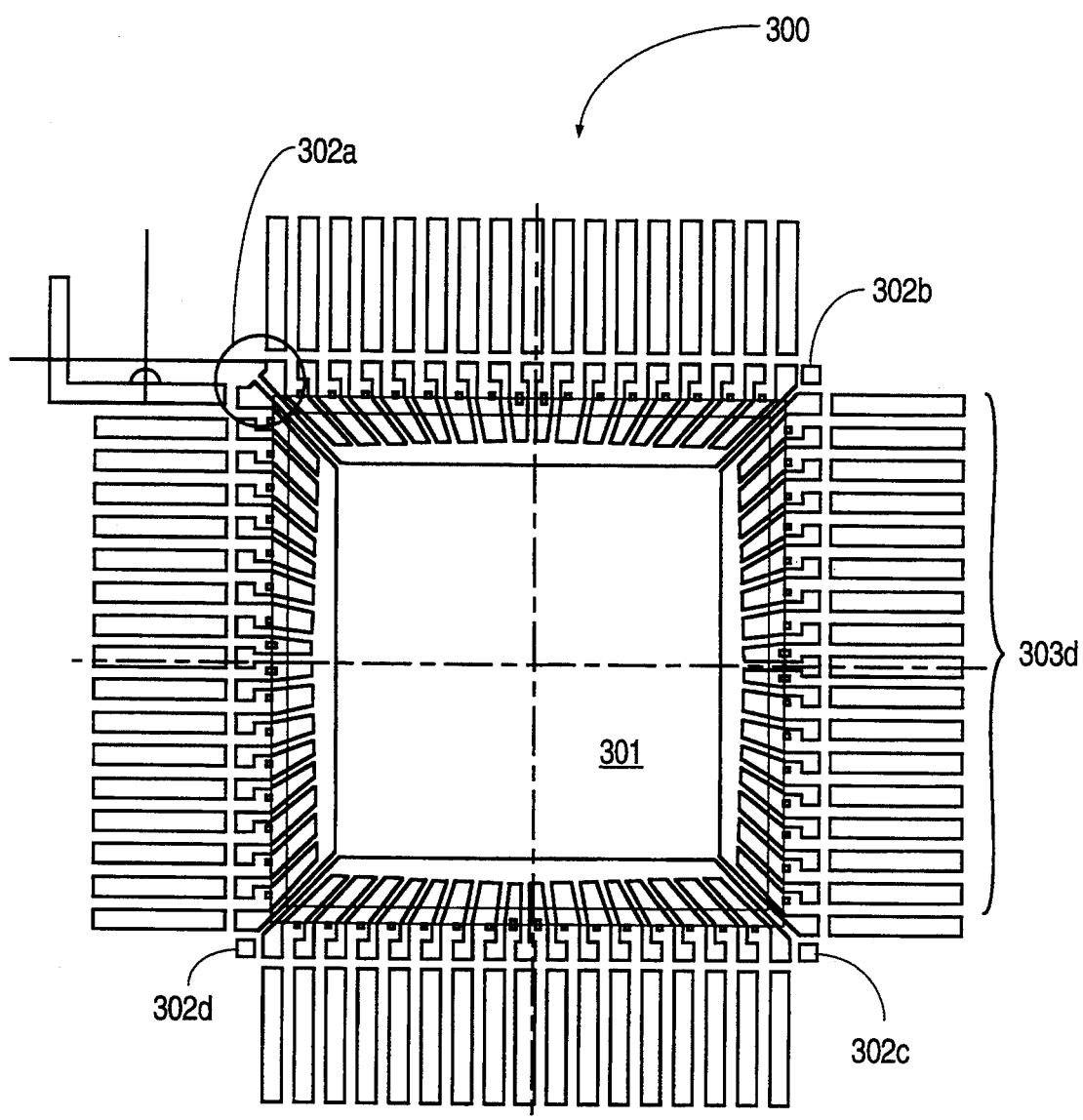
FIG. 3 shows a lead frame 300 suitable for implementing an embodiment of the present invention.

FIG. 3 shows a lead frame 300 suitable for implementing one embodiment of the present invention. As is known in the art, lead frame 300 can be formed by chemically etching a thin rectangular metal strip, using photolithography and chemical resists to form the lead frame pattern. Alternatively, lead frame 300 can also be formed using metal stamping and milling techniques. Lead frame 300 comprises a die attach pad 301, tie bars 302a–302d, and a number of leads, which are collectively referred to as leads 303. Lead frame 300 is suitable for use in a quad flat pack (QFP) package. In one embodiment, lead frame 300 is used in a 7 mm × 7 mm QFP package with 48 leads, each lead being 0.25 mm (0.010 in.) wide and 0.16 mm (0.0062 in.) thick. In that embodiment, the leads are located approximately 0.5 mm (0.020 in.) apart. Typically a lead frame, such as lead frame 300, is formed as one of many lead frames on a thin metal strip.

Figure 4A:
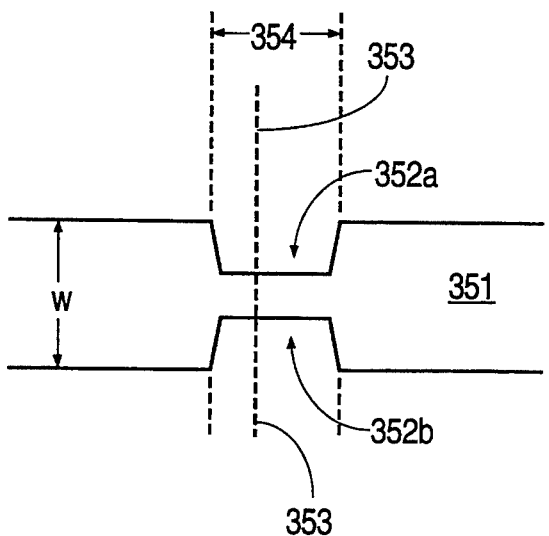
FIG. 4a is a top view of lead 351 of lead frame 300, showing notches 352a and 352b forming a neck area 354 about plane 353 along which lead 351 is expected to be trimmed.

In one embodiment, in accordance with the present invention, on each of leads 303, a notch is formed on each side of the lead to form a "neck" area at the position where the lead is expected to be trimmed. FIG. 4a shows a lead 351 of lead frame 300 having notches 352a and 352b formed in neck area 354. Dotted line 353 in neck area 354 indicates a plane along which lead 351 is expected to be trimmed. Notches 352a and 352b can be formed by modifying the photolithographic pattern of lead frame 300, to allow the notches to be etched at the same time lead frame 300 is formed. Alternatively, notches 352a and 352b can also be provided by separate photolithographical and etching steps after lead frame 300 is formed. Other methods, such as stamping and milling techniques, can also be used to create notches 352a and 352b. Preferably, the width of neck area 354 between notches 352a and 352b is approximately a third of width W of lead 351 outside of neck area 354, and the length of each of notches 352a and 352b approximates the thickness T of lead 351.

Because the width of lead 351 at neck area 354 is reduced by notches 352a and 352b, the area of exposed base metal when lead 351 is trimmed is reduced by more than 66 per cent. At the same time, at a subsequent plating step, the solder material coats over a larger total surface area.

Figure 4B:
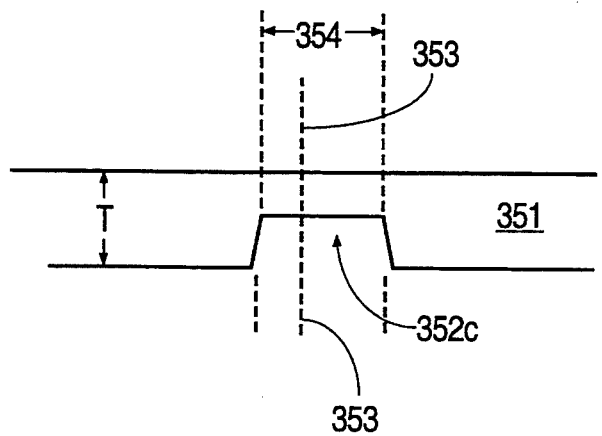
FIG. 4b is a side view of lead 351 of lead frame 300 showing a trench 352c at neck area 354 etched into lead 351, reducing the thickness of lead 351 at neck area 354 by about one half.
Figure 4C:
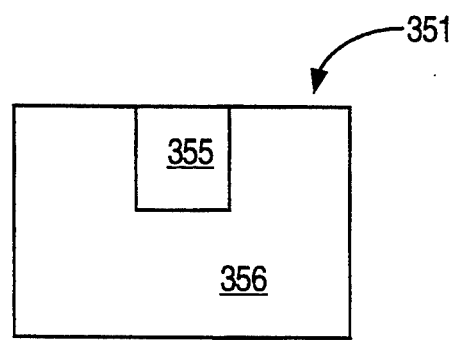
FIG. 4c is a cross-sectional view of lead 351 after coating by a solder material; the solder material 356 forming a fillet in the neck area 354.

In this embodiment, the area of exposed base metal resulting from trimming lead 351 is further reduced by creating in neck area 354 a trench 352c which reduces the thickness of lead 351 at neck area 354 by approximately one half. FIG. 4b is a side view of lead 351 showing trench 352c in neck area 354. Thus, when lead 351 is trimmed along plane 353, the combined effects of notches 352a and 352b, and trench 352c reduce the exposed area of base metal by approximately 85 per cent. Correspondingly, the surface area coated by the soldering material is also greatly increased. In fact, a fillet can be formed at the neck area 354 of lead 351. FIG. 4c shows a cross section of lead 351 along plane 353 showing the minimized exposed area of base metal 355 and the fillet 356 formed by the solder material.

Figure 5A:
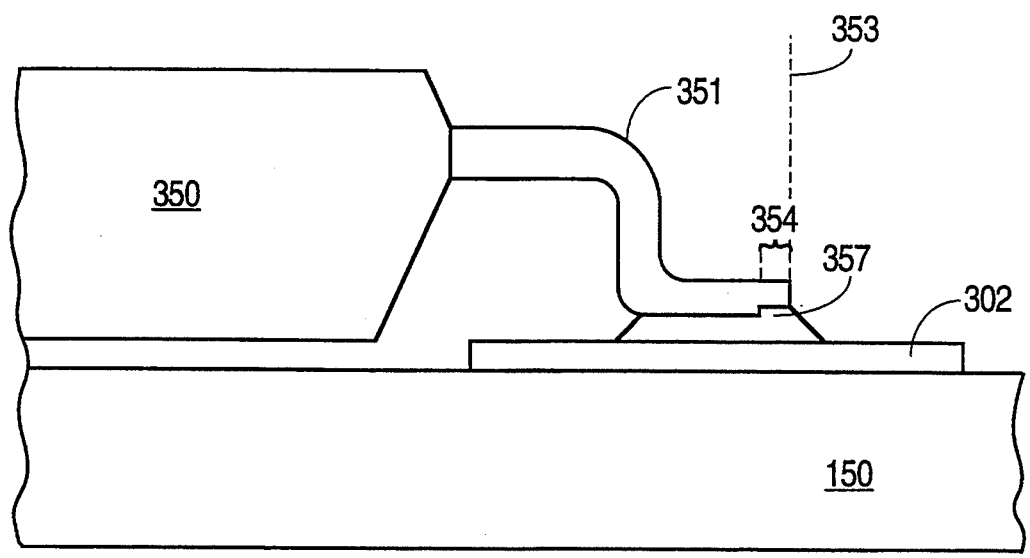
FIG. 5a and 5b are respectively side and top views of lead 351 showing wetting resulting from solder material coated in neck area 354.
Figure 5B:
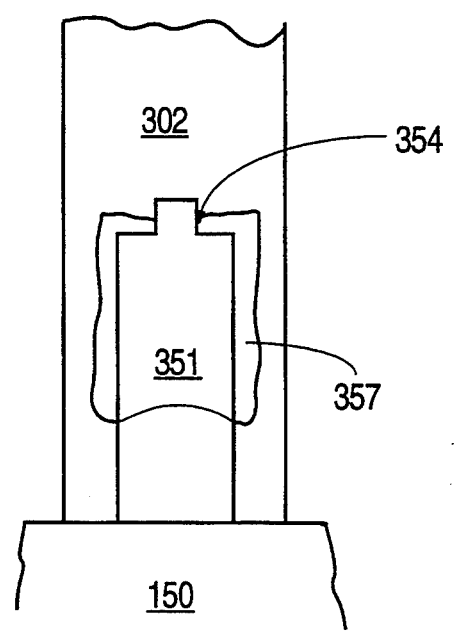

When lead 351 is trimmed along plane 353, neck area 354 forms a wetting tip of solder material which maximizes wetting onto the conductive trace of the printed circuit board. FIG. 5a and 5b are respectively side and top views of lead 351 showing wetting resulting from solder material coated in neck area 354. In FIG. 5a, lead 351 of surface mount package 350 is shown to be mounted on printed circuit board 150. Because of the fillet formed in neck area 354, solder wetting 357 is shown all the way around the portion of lead 351 in contact with conductive trace 302.

One of ordinary skill would appreciate that a similar result within the scope of the present invention can be achieved by having a single notch on one side of lead 351, rather than notches 352a and 352b on both sides of lead 351. In that case, the single notch can be formed twice as deep as each of notches 352a and 352b.

The above detailed description is provided to illustrate the specific embodiments of the present invention and is not intended to be limiting. Many modifications and variations within the scope of the present invention are possible. The present invention is set forth by the following claims.

I claim:

1. In a lead frame of an integrated circuit package having a plurality of leads for contact with metal traces on a printed circuit board, a lead comprising:

an elongated base metal core having a first portion of a first cross sectional area along substantially the entire length of said elongated base metal core, and having a second portion of a second cross sectional area at one end of said elongated base metal core, said first cross sectional area being substantially greater than said second cross section area, wherein each of said first and second portions also including a first surface along said length of said elongated base metal core, such that when said first surface of said first portion is placed in contact with one of said metal traces on said printed circuit board, said first surface of said second portion is positioned a predetermined distance from said metal trace; and a coat of solder material covering the surface of said elongated base metal core except at a second surface at said second portion of said elongated base metal core, said second surface being a surface of said second cross sectional area exposed by a cross section of said elongated base metal core.

2. A lead as recited in claim 1, wherein said minor surface being exposed by trimming said lead at said end of said of said elongated base metal core.

3. A lead as in claim 1, wherein said first and second cross sections are each substantially rectangular.

* * * * *